United States Patent
Wang (10) Patent No.: US 11,315,796 B2
(45) Date of Patent: Apr. 26, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/848,118

(22) Filed: Apr. 14, 2020

(65) Prior Publication Data
US 2020/0328085 A1    Oct. 15, 2020

(30) Foreign Application Priority Data
Apr. 15, 2019    (CN) .......................... 201910300469.X (51) Int. Cl.
*H01L 21/308* (2006.01)
*H01L 21/8234* (2006.01)
(Continued)

(52) U.S. Cl.
CPC ...... *H01L 21/3088* (2013.01); *H01L 21/3081* (2013.01); *H01L 21/3085* (2013.01); *H01L 21/3086* (2013.01); *H01L 21/823412* (2013.01); *H01L 21/823418* (2013.01); *H01L 21/823431* (2013.01); *H01L 27/0886* (2013.01); *H01L 29/0847* (2013.01); *H01L 29/66795* (2013.01); *H01L 29/785* (2013.01)

(58) Field of Classification Search
CPC ............. H01L 21/3081; H01L 21/3085; H01L 21/3086; H01L 21/3088; H01L 21/823431; H01L 27/0886; H01L 29/66795; H01L 29/785; H01L 29/7851
See application file for complete search history.

(56) References Cited

U.S. PATENT DOCUMENTS

8,975,129 B1 * 3/2015 Shieh ................. H01L 21/3086
                                                                  438/199
9,685,440 B1 * 6/2017 Cheng ............ H01L 21/823481
(Continued)

*Primary Examiner* — Joseph C. Nicely
(74) *Attorney, Agent, or Firm* — Anova Law Group, PLLC (57) ABSTRACT

Semiconductor structures and fabrication methods are provided. An exemplary fabrication method includes providing a substrate having a first region, second regions and third regions; and forming a patterned structure on the substrate. The patterned structure includes at least one first patterned layer on the first region, at least one second patterned layer on the second region and at least one third patterned layer on the third region, the at least one first patterned layer is discrete from the at least one second region and the at least one second region is discrete from the at least one third region. The method also includes removing the second patterned layer; and etching the substrate using the first patterned layer and the third patterned layer as an etching mask to form a base substrate, the first fin on the base substrate and the third fin on the base substrate.

20 Claims, 4 Drawing Sheets

(51) Int. Cl.
    *H01L 27/088*     (2006.01)
    *H01L 29/08*     (2006.01)
    *H01L 29/66*     (2006.01)
    *H01L 29/78*     (2006.01)

(56) References Cited

U.S. PATENT DOCUMENTS

| | | | |
|---|---|---|---|
| 9,842,931 B1* | 12/2017 | Anderson | H01L 21/823431 |
| 10,083,878 B1* | 9/2018 | Greene | H01L 21/823821 |
| 10,204,784 B1* | 2/2019 | Gao | H01L 21/0337 |
| 2015/0279684 A1* | 10/2015 | Wei | H01L 21/475 |
| | | | 438/424 |
| 2015/0311085 A1* | 10/2015 | Kozarsky | H01L 21/3086 |
| | | | 257/401 |
| 2017/0069504 A1* | 3/2017 | Li | H01L 29/0657 |
| 2017/0170174 A1* | 6/2017 | Chang | H01L 29/66545 |
| 2018/0114699 A1* | 4/2018 | Mohanty | H01L 29/66795 |
| 2019/0103318 A1* | 4/2019 | Wang | H01L 21/76224 |
| 2019/0221439 A1* | 7/2019 | Kim | H01L 21/823431 |
| 2019/0333806 A1* | 10/2019 | Huang | H01L 21/0338 |
| 2019/0378763 A1* | 12/2019 | Wang | H01L 21/823431 |
| 2020/0013873 A1* | 1/2020 | Wang | H01L 29/7851 |
| 2020/0235204 A1* | 7/2020 | Cheng | H01L 27/0886 |
| 2020/0294810 A1* | 9/2020 | Jin | H01L 21/0214 |
| 2021/0111032 A1* | 4/2021 | Cheng | H01L 21/31138 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201910300469.X, filed on Apr. 15, 2019, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

In the field of semiconductor technology, transistors are currently being widely used as the most basic semiconductor devices. Fin field-effect transistors (FinFETs) are a new type of complementary metal-oxide-semiconductor (CMOS) transistors. FinFETs are able to improve the control to the transistors, reduce leakage current, shorten the gate length of the transistors, and significantly increase chip processing speed and reduce the power consumption. Thus, FinFETs have been widely used in circuits of various semiconductor devices.

Due to the development of integrated circuits to ultra-large-scale integrated (VLSI) circuits, the circuit density of the VLSI circuits is getting larger and larger. With the reduction of the technology node, the size of the formed semiconductor structures have become smaller and smaller, and the difficulty of the process for forming FinFETs with various sizes has also increased.

Thus, there is a need to improve the performance of the FinFETs. The disclosed methods and semiconductor structures are directed to solve one or more problems set forth above and other problems in the art.

BRIEF SUMMARY OF THE DISCLOSURE

One aspect of the present disclosure includes a method for forming a semiconductor structure. The method may include providing a substrate having a first region, a plurality of second regions and a plurality of third regions. The first region may be located between two adjacent third regions, one second region may be located at each side of the first region, and each of the plurality of second regions may be located between the first region and one of the plurality of third regions. The method may also include forming a patterned structure on the substrate. The patterned structure may include at least one first patterned layer on the first region, at least one second patterned layer on the second region and at least one third patterned layer on the third region. The at least one first patterned layer may be discrete from the at least one second region and the at least one second region may be discrete from the at least one third region. Further, the method may include removing the at least one second patterned layer; and after removing the at least one second patterned layer, etching the substrate using the at least one first patterned layer and the at least one third patterned layer as an etching mask to form a base substrate, at least one first fin on the base substrate and at least one third fin on the base substrate.

Another aspect of the present disclosure includes a semiconductor structure. The semiconductor structure may include a base substrate having a first region, a plurality of second regions and a plurality of third regions. The first region may be located between two adjacent third regions, one second region may be located at each side of the first region, and each of the plurality of second regions may be located between the first region and one of the plurality of third regions. The semiconductor structure may also include at least one first fin formed on the first region of the base substrate; and at least one third fin formed on the third region of the base substrate. The base substrate, the at least one first fin and the at least one third fin may be formed from a substrate having the first region, the plurality of second regions and the plurality of third regions by forming a patterned structure having at least one first patterned layer on the first region, at least one second patterned layer on the second region and at least one third patterned layer on the third region. The at least one first patterned layer may be discrete from the at least one second region and the at least one second region may be discrete from the at least one third region. Then, the at least one second patterned layer may be removed and the substrate may be etched using the at least one first patterned layer and the at least one third patterned layer as an etching mask to form the base substrate, the at least one first fin on the base substrate and the at least one third fin on the base substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
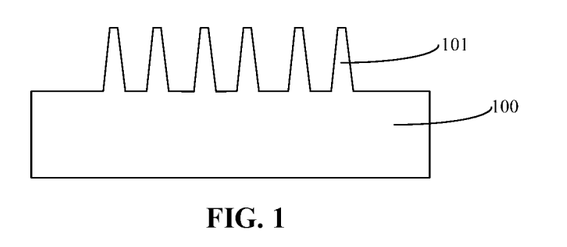
FIGS. 1-3 illustrate semiconductor structures corresponding to certain stages during a fabrication process of a semiconductor structure.
Figure 2:
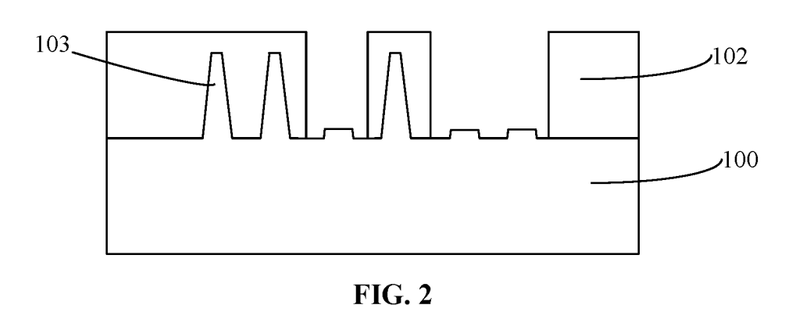
Figure 3:
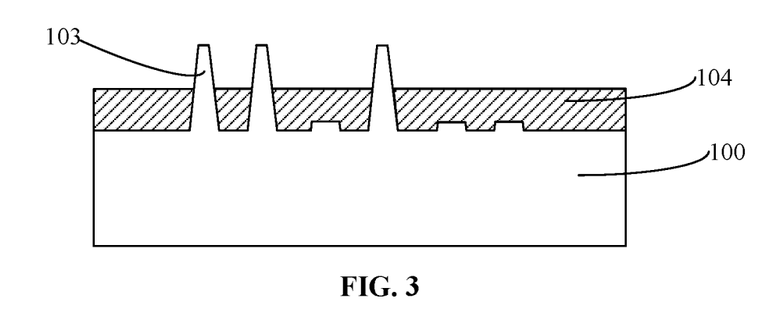

FIGS. 1-3 illustrate structures corresponding to certain stages during a fabrication process of a semiconductor structure.

As shown in FIG. 1, the fabrication process includes providing a base substrate 100. A plurality of fins 101 are formed on the base substrate 100. The plurality of fins 101 are discrete from each other.

Further, as shown in to FIG. 2, a mask layer 102 is formed on the base substrate 100 and the plurality of fins 101. The mask layer 102 exposes a portion (a certain number) of the plurality of fins 101. Then, the portion of the plurality of fins 101 are removed to form targeted fins 103.

Further, referring to FIG. 3, after forming the targeted fins 103, the mask layer 102 is removed, and an isolation structure 104 is formed on the base substrate 100. The isolation structure 104 covers portions of the sidewall surfaces of the targeted fins 103 and the top surface of the isolation structure is lower than the top surfaces of the targeted fins 103.

During the process for removing the portion of the plurality of fins 101, because the spacing between the adjacent fins 101 is substantially small, the bottom portions of the targeted fins 103 are larger than the top portions of the targeted fins 103 due to the etching process. Thus, when forming the mask layer 102 on the targeted fins 103, to ensure that the targeted fins 103 are completely covered, the mask layer 102 covers the adjacent dummy fins (the removed fins 102), and the dummy fins are not entirely removed. Further, to ensure that the dummy fins are entirely removed, the targeted fins 103 and the base substrate 100 are damaged when the dummy fins are over-etched. At the same time, to meet the diversity requirements of the device, it is also required to form fins of different sizes, fins of different pitches, or isolation structures 104 of different thicknesses on the same base substrate. When the fin pitch is substantially large, the etching process for forming the targeted fins has a small etching rate. When the fin pitch is substantially small, the etching process for forming the targeted fins has a large etching rate. When the fin pitches are inconsistent, the fins formed by the etching process are likely to be inconsistent in size. Accordingly, the performance of the semiconductor structure may be adversely affected.

The present disclosure provides a semiconductor structure and a method for forming a semiconductor structure. In the method for forming a semiconductor structure, before forming the fins by etching the substrate, the second patterned layer adjacent to the first patterned layer for forming the first fins may be removed first. The first patterned layer and the third patterned layer may be used as an etching mask to form the first fins and the third fins by an etching process. The spacing between the first fins and the third fins may be substantially large. Thus, the morphologies of the base substrate and the first fins formed on the base substrate may be as desired; and the performance of the semiconductor structure may be enhanced.

Figure 9:
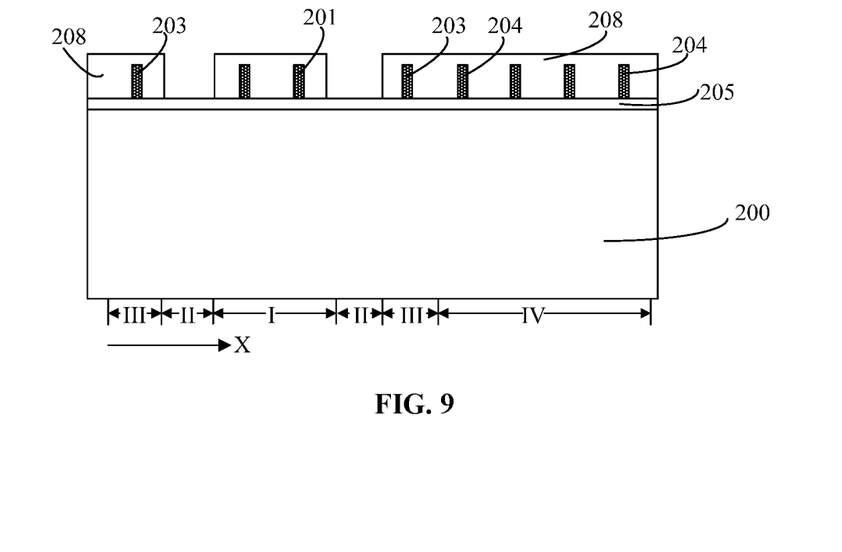
Figure 10:
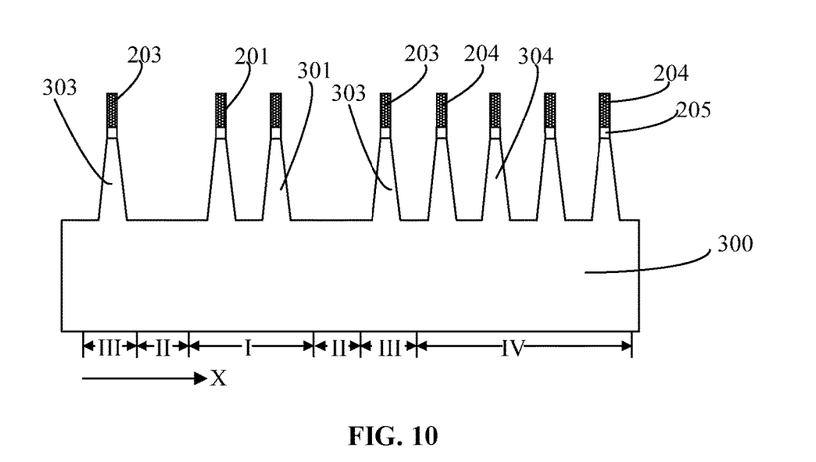
Figure 11:
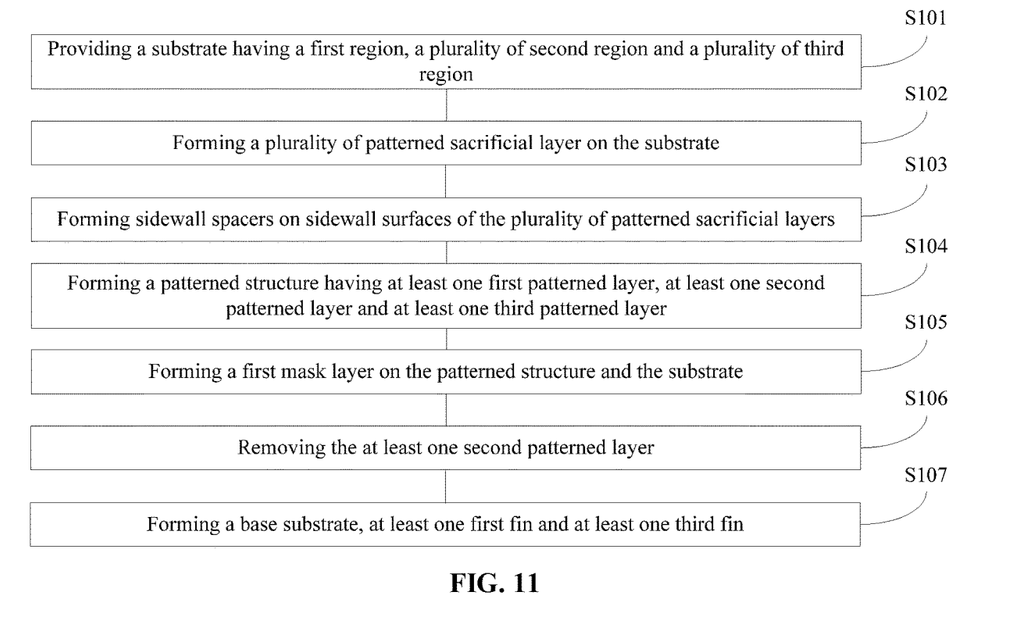
FIG. 11 illustrates an exemplary fabrication process of a semiconductor structure consistent with various disclosed embodiments of the present disclosure.

FIG. 11 illustrates an exemplary fabrication process of a semiconductor structure consistent with various disclosed embodiments of the present disclosure. FIGS. 4-10 illustrate structures corresponding to certain stages during the exemplary fabrication process consistent with various disclosed embodiments of the present disclosure.

Figure 4:
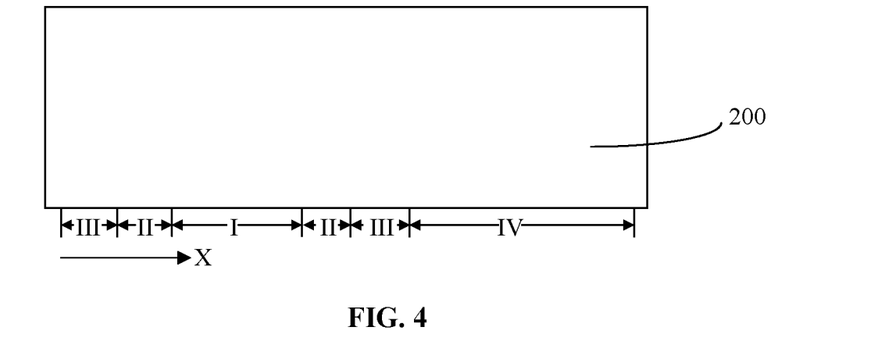
FIGS. 4-10 illustrate structures corresponding to certain stages during an exemplary fabrication process of a semiconductor structure consistent with various disclosed embodiments of the present disclosure.

As shown in FIG. 11, at the beginning of the fabrication process, a base substrate with certain structures is provided (S101). FIG. 4 illustrates a corresponding structure.

As shown in FIG. 4, a substrate 200 is provided. The substrate 200 may include a first region I, a plurality of second regions II, and a plurality of third regions III. The first region I may be located between two adjacent third regions III. Two second regions II may be located at the two sides of the first region I, respectively; and each of the second regions II may be located between a first region I and an adjacent third region III.

The substrate 200 may be made of a semiconductor material, such as single crystal silicon, polycrystalline silicon, amorphous silicon, germanium, silicon germanium, or gallium arsenide, etc. In one embodiment, the substrate 200 is made of single crystal silicon.

In one embodiment, the substrate 200 may further include a fourth region IV. The fourth region IV may be a region in which fins are densely formed. In some embodiments, there may be no fourth region.

A patterned structure may be formed on the substrate 200. The patterned structure may include at least one first patterned layer on the first region I, at least one second patterned layer on the second region II, and at one third patterned layer on the third region III. The first patterned layer and the second patterned layer may be discrete from each other, and the second patterned layer and the third patterned layer may be discrete from each other.

In one embodiment, a plurality of mutually discrete fourth patterned layers may be formed on the fourth region IV of the substrate 200.

Figure 5:
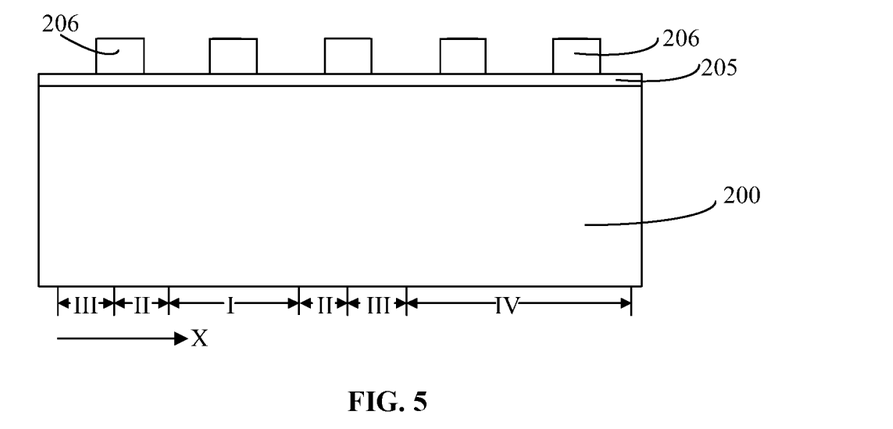

Returning to FIG. 11, after providing the substrate, a plurality of patterned sacrificial layers may be formed (S102). FIG. 5 illustrates a corresponding structure.

As shown in FIG. 5, a plurality of patterned sacrificial layers 206 may be formed on the first region I, the plurality of second regions II, the plurality of third regions III, and the fourth region IV of the substrate 200. Before forming the plurality of patterned sacrificial layers 206, a stop layer 205 may be formed on the first region I, the second regions II, the third regions III, and the fourth region IV of the substrate 200. The stop layer 205 may be formed by a deposition process.

The method for forming the plurality of patterned sacrificial layers 206 may include forming a sacrificial material layer (not shown) on the stop layer 205; forming a third mask layer (not shown) on the sacrificial material layer to expose portions of the sacrificial material layer on the first region I, the plurality of second regions II, the plurality of third regions III, and the fourth region IV; etching the sacrificial material layer using the third mask layer as an etching mask to form the plurality of patterned sacrificial layers 206 having a same pitch and being discrete from each other on the first region I, the plurality of second regions II, the plurality of third regions III, and the fourth region IV.

The sacrificial material layer may be formed by any appropriate process. In one embodiment, the sacrificial material layer is formed by a deposition process. The sacrificial material layer may be made of any appropriate material, such as silicon oxide, etc.

Figure 6:
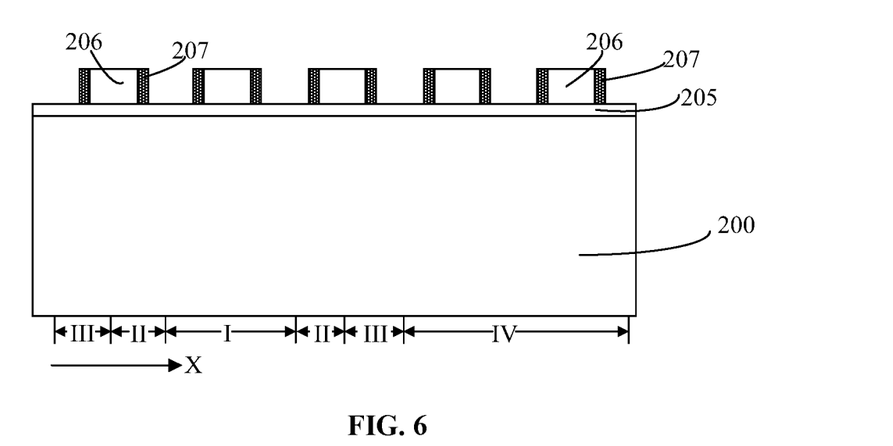

Returning to FIG. 11, after forming the plurality of patterned sacrificial layers, sidewall spacers may be formed (S103). FIG. 6 illustrates a corresponding structure.

As shown in FIG. 6, a plurality of sidewall spacers 207 may be formed on the sidewall surfaces of the plurality of sacrificial layers 206. In particular, one sidewall spacer 207 may be formed on each sidewall surface of the plurality sacrificial layers 206.

The method for forming the plurality of sidewall spacers 207 may include forming a sidewall spacer material layer (not shown) on the substrate 200, the sidewall surfaces and the top surfaces of the plurality of sacrificial layers 206; and etching back the sidewall spacer material layer until the top surfaces of the plurality of sacrificial layers 206 and the stop layer 205 are exposed. Thus, a sidewall spacer 207 may be formed on each sidewall surface of the plurality of sacrificial layers 206.

The sidewall spacer material layer may be formed by any appropriate process. In one embodiment, the sidewall material layer is formed by a deposition process. The sidewall spacer material layer may be made of any appropriate material, such as silicon nitride, etc.

Figure 7:
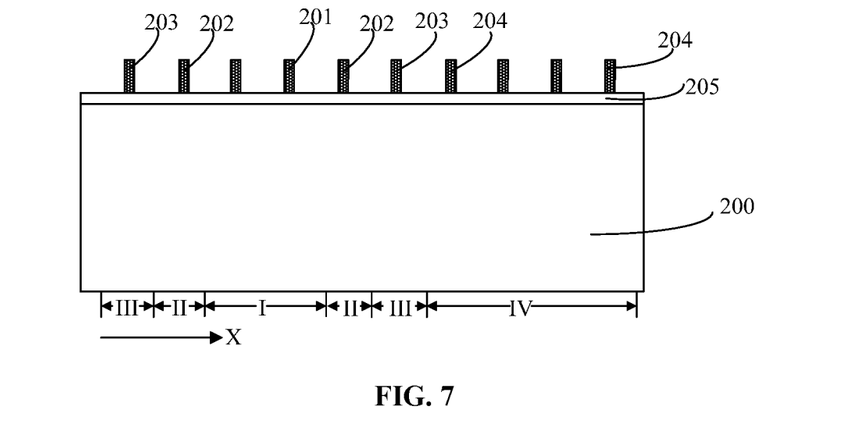

Returning to FIG. 11, after forming the plurality of the sidewall spacers, a patterned structure may be formed (S104). FIG. 7 illustrates a corresponding semiconductor structure.

As shown in FIG. 7, the plurality of sacrificial layers 206 may be removed, and a patterned structure including a plurality of sidewall spacers 207 on the sidewall surfaces of the plurality of sacrificial layers 206 may be formed. The patterned structure may include at least one first patterned layer 201 on the first region I, at least one second patterned layer 202 on each of the plurality second region II, at least one third patterned layer 203 on each of the plurality of third regions III, and a plurality of fourth patterned layers 204 on the fourth region IV.

In one embodiment, the plurality of fourth patterned layers 204 may be formed simultaneously with the at least one first patterned layer 201, the at least one second patterned layer 202, and the at least one third patterned layer 203. The at least one first patterned layer 201, the at least one second patterned layer 202, and the at least one third patterned layer 203 and the plurality of fourth patterned layers 204 may be arranged along a first direction X. Along the first direction X, the spacing between the second patterned layer 202 and an adjacent first patterned layer 201, the spacing between the second patterned layer 202 and an adjacent third patterned layer 203 and the spacing between adjacent fourth patterned layers 204 may be the same.

In one embodiment, the at least one first patterned layer 201 on the first region I includes one or more than one first patterned layers 201. When the at least one first patterned layer 201 on the first region I includes more than one first patterned layers 201, the plurality of first patterned layers 201 may be discrete from each other.

In one embodiment, the at least one second patterned layer 202 on the second region II may include one second patterned layer 202.

In one embodiment, the at least one third patterned layer 203 on the third region III may include one or more than one third patterned layers 203. When the at least one third patterned layer 203 on the third region III includes more than one third patterned layer, the plurality of third patterned layers 203 may be discrete from each other.

After forming the patterned structure, the at least one second patterned layer 202 may be removed.

Figure 8:
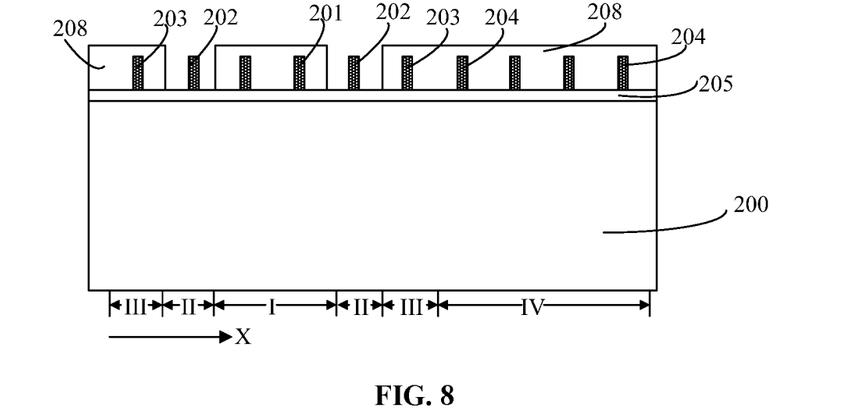

Returning to FIG. 11, after forming the patterned structure, a first mask layer may be formed (S105). FIG. 8 illustrates a corresponding structure.

As shown in FIG. 8, a first mask layer 208 may be formed on the substrate 200 and the patterned structure. The first mask layer 208 may expose the second patterned layer 202 in each of the plurality second regions II.

The first mask layer 208 may be made of any appropriate material. In one embodiment, the first mask layer 208 is made of photoresist.

Returning to FIG. 11, after forming the first mask layer, the second patterned layers may be etched (S106). FIG. 9 illustrates a corresponding semiconductor structure.

As shown in FIG. 9, the second patterned layer 202 in each of the plurality of second regions II may be etched using the first mask layer 208 as an etching mask until the surface of the stop layer 205 is exposed. In particular, the second patterned layers 202 may be removed by the etching process.

The second patterned layers 202 may be etched by any appropriate process. In one embodiment, the process for etching the second patterned layers 202 may include a dry etching process or a wet etching process.

After etching (removing) the second patterned layers 202, the first mask layer 208 may be removed.

Returning to FIG. 11, after removing the second patterned layers, a base substrate, at least one first fin and at least one third fin may be formed (S107). FIG. 10 illustrates a corresponding structure.

As shown in FIG. 10, after removing the first mask layer 208, the stop layer 205 and the substrate 200 may be etched using the at least one first patterned layer 201 and the at least one third patterned layer 203 as an etching mask to form a base substrate 300, at least one first fin 301 on the base substrate 300 and at least one third fin 303 on the base substrate 300. The at least one first fin 301 may be formed by the etching process using the at least one first pattern layer 201 as an etching mask, and the at least one third fin 203 may be formed by the etching process using the at least one third patterned layer 203 as an etching mask.

In one embodiment, a plurality of fourth fins 304 may be formed on the base substrate 300. The plurality of fourth fins 304 may be formed by the etching process using the plurality of fourth patterned layers 204 as an etching mask.

In one embodiment, the process for etching the substrate 200 to form the base substrate 300, the at least one first fin 301 on the base substrate 300, the at least one third fin 303 on the base substrate 300, and the plurality of fourth fins 304 on the base substrate 300 may include a dry etching process.

In the present embodiment, because the at least one second patterned layer 202 may be removed before forming the at least one first fin 301 and the at least one third fin 303, the formation of additional fins due to the presence of the at least one second patterned layer 202 may be avoided. Thus, the problem that the surface of the base substrate 300, the surface of the at least one first fin 301 and/or the at least one third fin 303 is additionally damaged by the removal of the additional fin may be avoided. Further, the pitch between the first fin 301 and the adjacent third fin 303 may be substantially large, the method for forming the at least one first fin 301 and the at least one third fin 303 may be applicable to form a plurality of fins with different pitches.

In one embodiment, a plurality of mutually discrete fourth fins 304 may be formed on the fourth region IV. Because the at least one second patterned layer 202 may be removed first, the spacing between the at least one first fin portion 301 and the at least one third fin 303 may be greater than the spacing between adjacent fourth fins 304. Because the at least one second patterned layer 202 may include one second patterned layer 202 on the second region II, the difference between the pitch between the at least one first patterned layer 201 and the at least one third patterned layer 203 and the pitch between the adjacent fourth patterned layers 204 may be substantially small. Accordingly, the difference in the topography and the size of the at least one first fin 301 and the at least one third fin 303 with respect to the plurality of fourth fins 304 may be substantially small, and the uniformity of the topography and the size of the at least one first fin 301, the at least one third fin 303 and the plurality of fourth fins 304 on the base substrate 300 may be improved. Thus, the performance of the semiconductor structure may be improved.

In some embodiments, after forming the at least one first fin 301, the at least one third fin 303, and the plurality of fourth fins 304, the at least one third fin 303 may be removed.

The method for removing the at least one third fin 303 may include forming a second mask layer (not shown) on the base substrate 300, the at least one first fin 301 and the at least one third fin 303 to expose the at least one third fin 303;

and etching the at least one third fin 303 using the second mask layer as an etching mask until the surface of the base substrate 300 is exposed.

The process for etching the at least one third fin 303 may include a dry etching process.

Because there may be a sufficient spacing between the at least one first fin 301 and the at least one third fin 303, the second mask layer may be able to protect the entire at least one first fin 301. Thus, the damage to the at least one first fin 301 and the base substrate 300 when removing the at least one third fin 303 may be avoided. Further, the issue that the at least one third fin 303 is not entirely removed caused by the substantially small distance between the at least one first fin 301 and the at least third fin 303 may be avoided.

In one embodiment, before removing the at least one third fin 303, a gate structure may be formed on the substrate 300. The gate structure may be across the at least one first fin 301.

In some embodiments, before removing the at least one third fin 303, a gate structure may be formed on the base substrate 300. The gate structure may be across the at least one first fin 301. Then, an epitaxial layer may be formed in the at least one first fin 301 at both sides of the gate structure.

The present disclosure also includes providing a semiconductor structure. An exemplary semiconductor consistent with various disclosed embodiments of the present disclosure is illustrated in FIG. 10.

As shown in FIG. 10, the semiconductor structure includes a base substrate 300. The base substrate 300 may include a first region I, a plurality of second regions II, a plurality of third regions III, and a fourth region IV. The first region I may be located between two adjacent third regions III. The first region I may be located between two adjacent second regions II. In particular, two second regions II may be located at two sides of the first region I, respectively. Each second region II may be located between a first region I and a third region III.

The semiconductor structure may also include at least one first fin 301 formed on the first region I of the base substrate 300 and at least one third fin 303 formed on the third region III of the base substrate 300. Further, the semiconductor structure may include a plurality of fourth fins 304 formed on the fourth region IV of the base substrate 300. The detailed structures and intermediate structures are described above with respect to the fabrication processes.

The technical solutions of the present disclosure may have at least the following beneficial effects.

In the present disclosure, the at least one second patterned layer may be removed before forming the at least one first fin and the at least one third fin. The at least one first patterned layer, the at least one second patterned layer and the at least one third patterned layer may be formed with other patterned layers in the other regions of the substrate simultaneously. Thus, the patterning process may be simplified and/or integrated. Further, the formation of additional fins due to the presence of the at least one second patterned layer may be avoided. Thus, the problem that the surface of the base substrate, the surface of the at least one first fin and/or the at least one third fin are damaged by the removal of the additional fin may be avoided. Further, the pitch between the first fin and the adjacent third fin may be substantially large, the method for forming the at least one first fin and the at least one third fin may be applicable to form a plurality of fins with different pitches. Thus, the morphology of the surfaces of the at least one first fin and the at least one third fin may be as desired; and the performance of the semiconductor structure may be improved.

Further, the fourth patterned layer on the fourth region may be used to form a plurality of mutually discrete fourth fins. After removing the at least one second patterned layer, the spacing between the at least one first fin and the at least one third fin may be greater than the spacing between adjacent fourth fins. Because the at least one second patterned layer may include one second patterned layer on the second region II, the difference between the pitch between the at least one first patterned layer and the at least one third patterned layer and the pitch between the adjacent fourth patterned layers may be substantially small. Accordingly, the difference in the topography and the size of the at least one first fin and the at least one third fin with respect to the plurality of fourth fins may be substantially small, and the uniformity of the topography and the size of the at least one first fin, the at least one third fin and the plurality of fourth fins on the base substrate may be improved. Thus, the performance of the semiconductor structure may be enhanced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a substrate having a first region, a plurality of second regions and a plurality of third regions, wherein the first region is located between two adjacent third regions, one second region is located at each side of the first region, and each of the plurality of second regions is located between the first region and one of the two adjacent third regions;
   forming a patterned structure on the substrate, wherein the patterned structure includes at least one first patterned layer on the first region, at least one second patterned layer on each of the plurality of second regions and at least one third patterned layer on each of the plurality of third regions, and each of the at least one first patterned layer, each of the at least one second patterned layer, and each of the at least one third patterned layer are discrete and isolated from each other;
   removing the at least one second patterned layer; and
   after removing the at least one second patterned layer, etching the substrate using the at least one first patterned layer and the at least one third patterned layer as an etching mask to form a base substrate, at least one first fin on the base substrate and at least one third fin on the base substrate.

2. The method according to claim 1, wherein the substrate further includes a fourth region, the method further comprising:
   forming a plurality of fourth patterned layers on the fourth region of the substrate; and
   etching the substrate using the plurality of fourth patterned layers as an etching mask to form a plurality of fourth fins on the base substrate.

3. The method according to claim 2, wherein:
   the plurality of the fourth patterned layers are formed simultaneously with the at least one first patterned layer, the at least one second patterned layer and the at least one third patterned layer;

the at least one first patterned layer, the at least one second patterned layer, the at least one third patterned layer and the plurality of fourth patterned layers are arranged along a first direction; and along the first direction, a spacing between a second patterned layer of the at least one second patterned layer and an adjacent first patterned layer of the at least one first patterned layer, a spacing between a second patterned layer of the at least one second patterned layer and an adjacent third patterned layer of the at least one third patterned layer and a spacing between two adjacent fourth patterned layers are same.

4. The method according to claim 1, wherein:
the at least one first patterned layer includes a plurality of first patterned layers, and the plurality of first patterned layers are discrete from each other.

5. The method according to claim 1, wherein:
the at least one second patterned layer includes one second patterned layer.

6. The method according to claim 1, wherein:
the at least one third patterned layer includes a plurality of third patterned layers, and the plurality of third patterned layers are discrete from each other.

7. The method according to claim 1, wherein forming the patterned structure comprises:
forming a plurality of patterned sacrificial layers on the first region, the plurality of second regions and the plurality of third regions of the substrate;
forming a sidewall spacer on each sidewall surface of the plurality of the patterned sacrificial layers; and
removing the plurality of the patterned sacrificial layers, wherein the plurality of sidewall spacers on the sidewall surfaces of the plurality of patterned sacrificial layers form the patterned structure.

8. The method according to claim 7, wherein forming the sidewall spacer on each sidewall surface of the plurality of patterned sacrificial layers comprises:
forming a sidewall spacer material layer on the substrate, the sidewall surfaces and top surfaces of the plurality of patterned sacrificial layers; and
etching-back the sidewall spacer material layer until the top surfaces of the plurality of patterned sacrificial layers and the substrate are exposed to form the sidewall spacers on the sidewall surfaces of the plurality of patterned sacrificial layers.

9. The method according to claim 7, wherein:
the plurality of patterned sacrificial layers are made of silicon oxide.

10. The method according to claim 1, wherein:
the patterned structure is made of silicon nitride.

11. A method for fabricating a semiconductor structure, comprising:
providing a substrate having a first region, a plurality of second regions and a plurality of third regions, wherein the first region is located between two adjacent third regions, one second region is located at each side of the first region, and each of the plurality of second regions is located between the first region and one of the two adjacent third regions;
forming a patterned structure on the substrate, wherein the patterned structure includes at least one first patterned layer on the first region, at least one second patterned layer on each of the plurality of second regions and at least one third patterned layer on each of the plurality of third regions, the at least one first patterned layer is discrete from the at least one second patterned layer and the at least one second patterned layer and is discrete from the at least one third patterned layer;

removing the at least one second patterned layer, wherein removing the at least one second patterned layer comprises:
forming a first mask layer on the substrate and the patterned structure to expose the at least one second patterned layer; and
etching the at least one second patterned layer using the first mask layer as an etching mask until a surface of the substrate is exposed; and after removing the at least one second patterned layer, etching the substrate using the at least one first patterned layer and the at least one third patterned layer as an etching mask to form a base substrate, at least one first fin on the base substrate and at least one third fin on the base substrate.

12. The method according to claim 11, wherein the substrate further includes a fourth region, the method further comprising:
forming a plurality of fourth patterned layers on the fourth region of the substrate; and
etching the substrate using the plurality of fourth patterned layers as an etching mask to form a plurality of fourth fins on the base substrate.

13. The method according to claim 12, wherein:
the plurality of the fourth patterned layers are formed simultaneously with the at least one first patterned layer, the at least one second patterned layer and the at least one third patterned layer;

the at least one first patterned layer, the at least one second patterned layer, the at least one third patterned layer and the plurality of fourth patterned layers are arranged along a first direction; and along the first direction, a spacing between a second patterned layer of the at least one second patterned layer and an adjacent first patterned layer of the at least one first patterned layer, a spacing between a second patterned layer of the at least one second patterned layer and an adjacent third patterned layer of the at least one third patterned layer and a spacing between two adjacent fourth patterned layers are same.

14. The method according to claim 11, wherein:
the at least one first patterned layer includes a plurality of first patterned layers, and the plurality of first patterned layers are discrete from each other.

15. The method according to claim 11, wherein:
the at least one second patterned layer includes one second patterned layer.

16. The method according to claim 11, wherein:
the at least one third patterned layer includes a plurality of third patterned layers, and the plurality of third patterned layers are discrete from each other.

17. A method for fabricating a semiconductor structure, comprising:
providing a substrate having a first region, a plurality of second regions and a plurality of third regions, wherein the first region is located between two adjacent third regions, one second region is located at each side of the first region, and each of the plurality of second regions is located between the first region and one of the two adjacent third regions;
forming a patterned structure on the substrate, wherein the patterned structure includes at least one first patterned layer on the first region, at least one second patterned layer on each of the plurality of second regions and at least one third patterned layer on each of the plurality of third regions, the at least one first patterned layer is discrete from the at least one second patterned layer and the at least one second patterned layer and is discrete from the at least one third patterned layer;

removing the at least one second patterned layer; and after removing the at least one second patterned layer, etching the substrate using the at least one first patterned layer and the at least one third patterned layer as an etching mask to form a base substrate, at least one first fin on the base substrate and at least one third fin on the base substrate, after forming the at least one first fin and the at least one third fin, further comprising:

removing the at least one third fin.

18. The method according to claim 17, wherein removing the at least one third fin comprises:

forming a second mask layer on the base substrate, the at least one first fin and the at least one third fin to expose the at least one third fin; and etching the at least one third fin using the second mask layer as an etching mask until a surface of the base substrate is exposed.

19. The method according to claim 17, before removing the at least one third fin, further comprising:

forming a gate structure across the at least one first fin on the base substrate.

20. The method according to claim 17, before removing the at least one third fin, further comprising:

forming a gate structure across the at least one first fin on the base substrate; and forming an epitaxial layer in the at least one first fin at both sides of the gate structure.

\* \* \* \* \*